US00RE34562E

United States Patent [19]

Murakami et al.

[11] E Patent Number: Re. 34,562

[45] Reissued Date of Patent: Mar. 15, 1994

[54] AMPLITUDE-ADAPTIVE VECTOR QUANTIZATION SYSTEM

[75] Inventors: Tokumichi Murakami; Masami Nishida; Atsushi Ito, all of Kanagawa, Japan

[73] Assignee: Mitsubishi Denki Kabushiki Kaisha, Tokyo, Japan

[21] Appl. No.: 761,501

[22] PCT Filed: Oct. 16, 1987

[86] PCT No.: PCT/JP87/00793

§ 371 Date: May 26, 1988

§ 102(e) Date: May 26, 1988

[87] PCT Pub. No.: WO88/02975

PCT Pub. Date: Apr. 21, 1988

Related U.S. Patent Documents

Reissue of:

[64] Patent No.: 4,878,230
Issued: Oct. 31, 1989
Appl. No.: 207,155
Filed: May 26, 1988

[30] Foreign Application Priority Data

Oct. 16, 1986 [JP] Japan ..... 61-246396
Jan. 20, 1987 [JP] Japan ..... 62-10487

[51] Int. Cl.[5] ..... H04B 14/06

[52] U.S. Cl. ..... 375/27; 375/122; 348/417

[58] Field of Search ..... 375/27, 30, 122; 358/133, 135, 136; 381/36, 41, 43, 31; 364/518, 807

[56] References Cited

U.S. PATENT DOCUMENTS

| | | | |
|---|---|---|---|
| 4,558,350 | 12/1985 | Murakami | 358/21 R |
| 4,560,799 | 12/1985 | Spivack et al. | 565/47 |
| 4,639,778 | 1/1987 | Yamaguchi et al. | 358/135 |
| 4,670,851 | 6/1987 | Murakami | 364/518 |
| 4,680,797 | 7/1987 | Renke | 381/41 |
| 4,710,812 | 12/1987 | Murakami et al. | 358/136 |
| 4,724,535 | 2/1988 | Ono | 375/122 |
| 4,725,885 | 2/1988 | Gonzales et al. | 375/27 |
| 4,769,826 | 9/1988 | Kubo et al. | 358/136 |

OTHER PUBLICATIONS

Murakami et al "Vector Quantiser of Video Signals" Sep. 29, 1982 two pages.

Murakami et al "Dynamic Multistage Vector Quantization of Images" Electronics and Communications in Japan of Part 1, vol. 69 1986 pp. 93–101.

Gray "Vector Quantization", IEEE ASSP Magazine, Apr. 1984 pp. 4–29.

*Primary Examiner*—Stephen Chin

*Attorney, Agent, or Firm*—Rothwell, Figg, Ernst & Kurz

[57] ABSTRACT

An amplitude-adaptive vector quantization system intended for efficient signal coding and decoding. A mean value separation circuit (2) separates the mean value from an input signal which has been divided into blocks, and a tree-search vector quantizer (6) implements tree-search inner product vector quantization so that index information is truncated depending on the detected vector amplitude, thereby reducing the volume of information for transmission.

10 Claims, 6 Drawing Sheets

AMPLITUDE-ADAPTIVE VECTOR QUANTIZATION SYSTEM

Matter enclosed in heavy brackets [ ] appears in the original patent but forms no part of this reissue specification; matter printed in italics indicates the additions made by reissue.

BACKGROUND OF THE INVENTION

1. Field of the Art

This invention relates to a high-efficiency signal coding and decoding system and, particularly, to an amplitude-adaptive vector quantization system.

2. Background Technology

FIGS. 3 and 4 are block diagrams showing the coding and decoding sections, respectively, of a vector quantization system which uses the inner product for the computation of distortion. In FIG. 3, indicated by 1 is the input signal vector derived from a series of input signals divided into blocks in K-samples, 2 is a mean value separation circuit, 11 is the separated mean value, 13 is the mean separated input vector, 3 is a mean value DPCM (Differential PCM) quantizer, 29 is a vector quantizer, 31 is the amplitude gain produced through coding by the vector quantizer, 7 is an amplitude-gain DPCM quantizer, and 33 is the output vector index produced from the code of the vector quantizer. In FIG. 4, indicated by 19 is a mean value DPCM decoder, 20 is an amplitude-gain DPCM decoder, 24 is the DPCM-decoded mean value, 36 is the DPCM-decoded amplitude gain, 35 is a vector quantizing decoder, 38 is the decoded mean value separation vector, 23 is a mean value adding circuit, and 39 is the output signal vector.

Next, the operation wil be described. In the coding section of FIG. 3, the input signal vector 1 which is a series of input signals provided in the form of blocks is received by the mean value separation circuit 2 which separates the mean separated input vector 13 from the intra-vector mean value 11. The separated mean value 11 is subjected to predictive differential quantization (DPCM quantization) by the mean value DPCM quantizer 3, and information of the separated mean value 11 is reduced. The mean separated input vector 13 is subjected to inner product computation by the vector quantizer 29 with the output vector read out of a code book which is a set of output vectors prepared in advance in a statistical manner so that an output vector yielding a maximum inner product is selected. The vector quantizer 29 produces the output vector index 33 for the input mean separated input vector and also the inner product value as the amplitude gain 31 of the input mean separated input vector 13.

Vector quantization is expressed in terms of input signal vectors 13 $S=S_1S_2, \ldots, S_K$, mean value $\mu$, amplitude gain $\sigma^*$, and output vectors $y_i=[y_{i1}, y_{i2}, \ldots, y_{ik}]$, as follows.

$$\mu = \sum_{j=1}^{k} S_j/K$$

$$Q(S) = \sigma^* \cdot y_i + \mu \cdot U(U = [i, 1, \ldots, 1])$$
$$\text{if } (S - \mu \cdot U, y_i) > (S - \mu \cdot U, y_j)$$
$$\text{for all } j \neq i$$

-continued $$\begin{aligned}\sigma^* &= (S - \mu \cdot U, y_i)\\ &= |S - \mu \cdot U||y_i| \cos\theta_i\\ &= \sigma \cdot \cos\theta_i\end{aligned}$$

where $\sigma = |\underline{S} - \mu.\underline{U}\underline{U}|$ and $|\underline{y}i = 1$ are assumed.

Using the inner product, the vector distortion computation is reduced to the form of a product-sum which is easier for execution with a DSP (digital signal processor), and the amplitude component can be obtained at the same time. The amplitude gain 31 produced by the vector quantizer 29 is subjected to DPCM quantization by the DPCM quantizer 7 in the same way as for the mean value 11.

The DPCM-quantized mean value 12, amplitude gain 32 and output vector index 33 obtained as described above are coded and then transmitted or recorded.

The decoding section of FIG. 4 implements decoding for the three components, namely, the DPCM-quantized mean value 12, DPCM-quantized amplitude gain 32 and output vector index 33 provided by the coding section. The DPCM-quantized mean value 12 is DPCM-decoded by the DPCM decoder 19, which yields the decoded mean value 24. Similarly, the DPCM-quantized amplitude gain 32 is DPCM-decoded by the amplitude gain DPCM decoder 20, which yields the decoded amplitude gain 36.

The vector quantization decoder 35 outputs the normalized output vector 37 by decoding the output vector index 33, the amplitude reproduction circuit 22 reproduces the amplitude of the vector as output vector 38 from the decoded amplitude gain 36, the mean value adding circuit 23 adds the decoded mean value 24 to the decoded mean separated output vector 38, and the output signal vector 39 is reproduced.

In the conventional vector quantization system using the inner product for the computation of distortion, the amplitude component is obtained after vector quantization, and therefore the vector quantization index information cannot be reduced by varying the quantization stages of the tree-searched code book by the amplitude component or switching code books. If the use of inner product computation is eliminated for implementing the above-mentioned adaptive control by the amplitude component, it becomes difficult for the DSP (digital signal processor) to reduce the duty of hardware.

DISCLOSURE OF THE INVENTION

The present invention is intended to solve the foregoing problems, and its object is to provide a vector quantization system which is capable of reducing the volume of information of the vector quantization index by varying the quantization stage of a tree-searched code book depending on the vector amplitude component and also is capable of reducing the duty of hardware by means of DSP, while using the vector inner product for the computation of distortion.

The inventive vector quantization system adopts tree search for the vector quantizer, and is equipped with a calculator for the amplitude component of the mean separated input vector and an amplitude vs. quantization stage correspondence table for determining the quantization stage which meets the magnitude of the evaluated amplitude component. The tree-search vector quantizer is designed to produce the amplitude gain based on the result of quantization by the given quantization stage, and it includes an amplitude gain DPCM quantizer for DPCM-quantizing the evaluated amplitude gain, a second amplitude vs. quantization stage table for selecting the number of the quantization stage by producing indices depending on the DPCM-decoded amplitude gain, and a selector for selecting an index.

In the vector quantization system of this invention, the amplitude component calculator evaluates the amplitude component of the vector, and the tree-search vector quantizer produces an amplitude gain based on a deep or shallow quantization stage, in accordance with the amplitude vs. quantization stage table, in response to the magnitude of the amplitude component. After DPCM quantization and DPCM decoding, the amplitude gain is entered to the second amplitude vs. quantization stage table, which re-evaluates the quantization stage on the basis of the quantized amplitude gain and selects an output vector index depending on the quantization stage. The decoding section, by having a second amplitude vs. quantization stage correspondence table, determines the quantization stage from the DPCM-decoded amplitude gain, and the output vector index can be decoded.

According to another vector quantization system of this invention, the output vector is searched by tree search of n's notation system, and the assignment of variable length (will be termed "code") to the output vector is made to express the code of output vector at the node of the tree selected during the search of output vector at the last stage, by truncating the lowest position (will be termed "LSB") of the code of output vector at the last stage of tree structure. In addition, the stage of tree structure of the vector to be outputted is determined from the amplitude gain derived from the amplitude gain of the last stage output vector with respect to the input vector through DPCM quantization and DPCM decoding, the code of output vector obtained accordingly at the last stage is truncated from LSB.

The inventive vector quantization system first implements vector quantization up to the last stage by tree search of n's notation system for the mean value separation vector, and the amplitude gain resulting from the last quantization stage is assumed to be the amplitude gain of the output vector selected during the search up to the last stage. The amplitude gain at the last stage is subjected to DPCM quantization/decoding, an output vector of a shallow stage of tree structure or deep stage of tree structure depending on a large or small value of the resulting amplitude gain is selected through the truncating operation from LSB for the code of output vector obtained at the last stage.

DETAILED DESCRIPTION OF THE INVENTION

Figure 1:
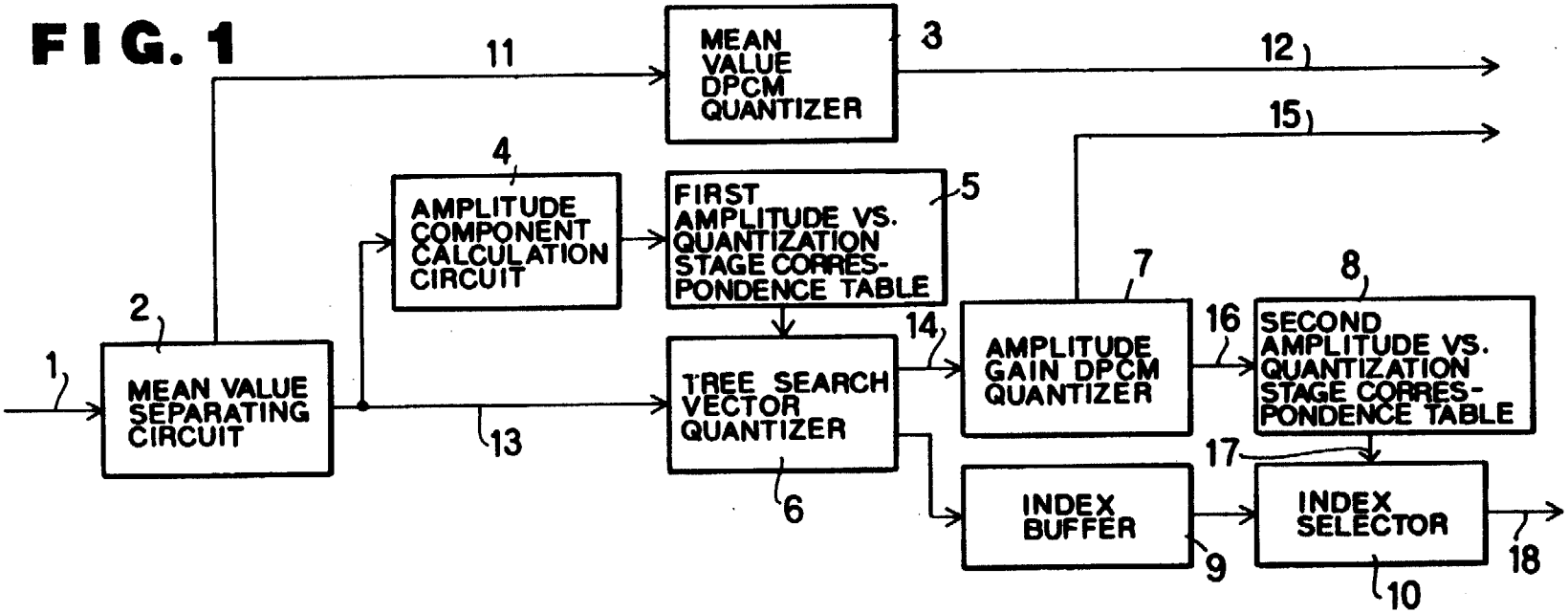
FIG. 1 is a block diagram of the coding section of the amplitude-adapted vector quantization system according to an embodiment of this invention.
Figure 2:
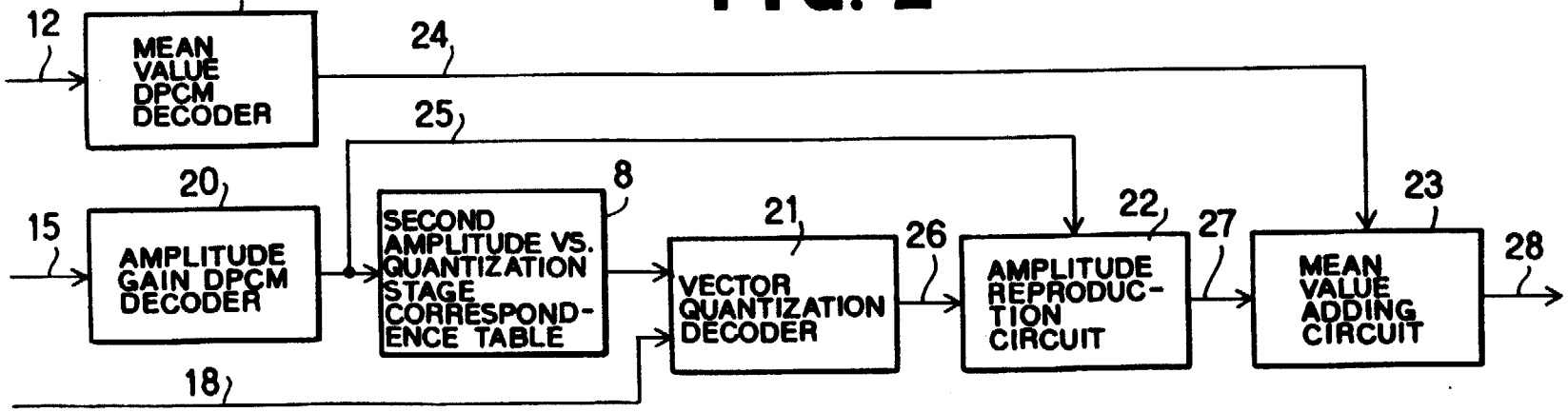
FIG. 2 is a block diagram of the decoding section.
Figure 3:
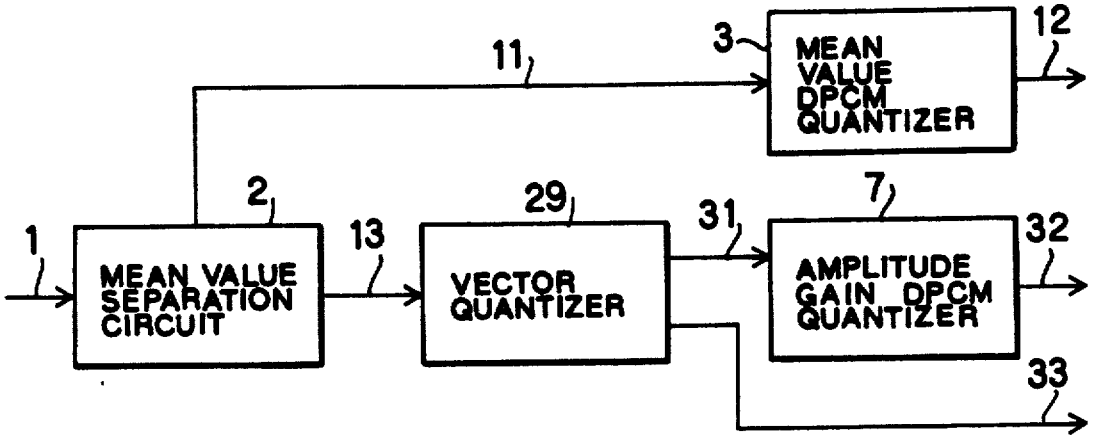
FIG. 3 is a block diagram of the coding section of the conventional vector quantization system.
Figure 4:
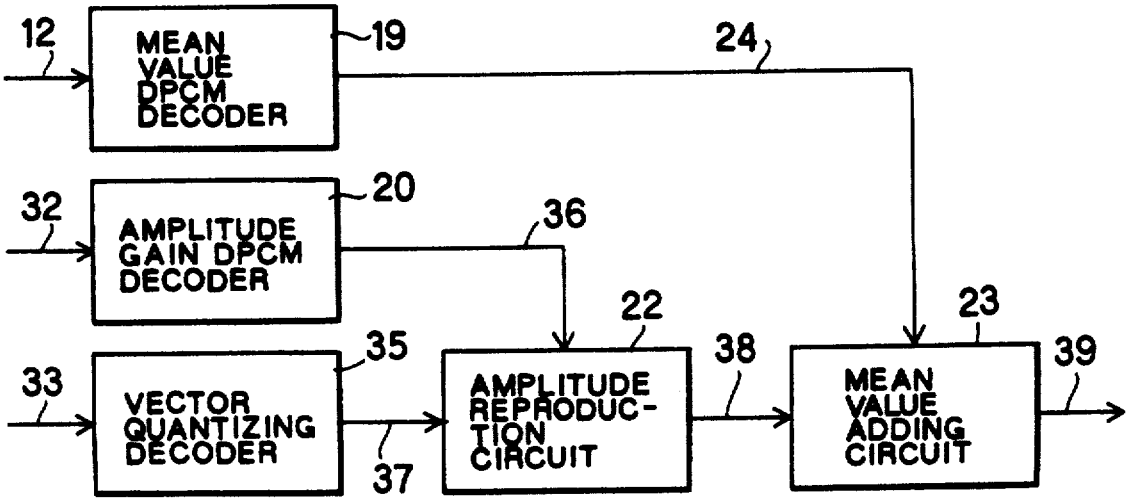
FIG. 4 is a block diagram of the decoding section.

An embodiment of this invention will be described with reference to the drawings, FIGS. 1 and 2 are block diagrams of the coding section and decoding section, respectively, of the vector quantization system according to this invention. In FIG. 1, indicated by 1 is the input signal vector, 2 is a mean value separating circuit, 11 is the separated mean value, 3 is a mean value DPCM quantizer, 12 is a DPCM-quantized mean value, 13 is the input vector which has the mean value, removed 4 is an amplitude component calculation circuit for the input vector, 5 is a first amplitude vs. quantization stage correspondence table for determining the stage of the tree-search vector quantizer from the magnitude of the calculated amplitude component, 6 is a tree-search vector quantizer which uses the inner product of the mean separated input vector for the distortion computation in vector quantization and produces the amplitude gain 14 with the stage number depending on the output of the first amplitude vs. quantization stage correspondence table 5, 7 is an amplitude gain DPCM quantizer, 15 is the DPCM-quantized amplitude gain, 16 is the DPCM-decoded amplitude gain, 8 is a second amplitude vs. quantization stage correspondence table for determining the stage of quantization for the output vector in accordance with the value of DPCM-decoded amplitude gain, 9 is an index buffer which fetches the output vector index at each quantization stage of the tree-search vector quantizer, 10 is an output vector index selector which selects a vector index to be outputted from the index buffer 9 in response to the signal 17 indicating the output vector stage number from the second amplitude vs. quantization stage correspondence table 8, and 18 is the output vector index.

FIG. 2 shows the decoding section of the vector quantizer according to this invention, in which indicated by 19 is a mean value DPCM decoder, 24 is the DPCM-decoded mean value, 20 is an amplitude gain DPCM decoder, 25 is the DPCM-decoded amplitude gain, 26 is the decoded output vector, 27 is the amplitude-reproduced output vector, and 28 is the output signal vector.

Figure 5:
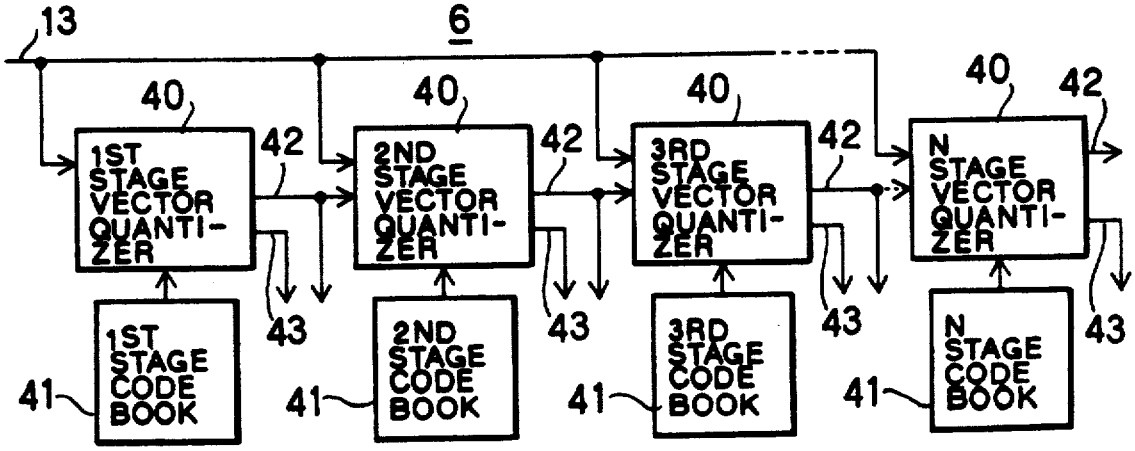
FIG. 5 is a block diagram of the tree-search vector quantizer.

FIG. 5 is a block diagram of the tree-search vector quantizer 6 shown in FIG. 1. Indicated by 40 are vector quantizers which use the inner product of vectors at stages for the distortion computation, 41 are code books including normalized output vectors at the stages, 42 are the output vector indices as the results of quantization at the stages, and 43 are the amplitude gains as the result of quantization at the stages.

Figure 6:
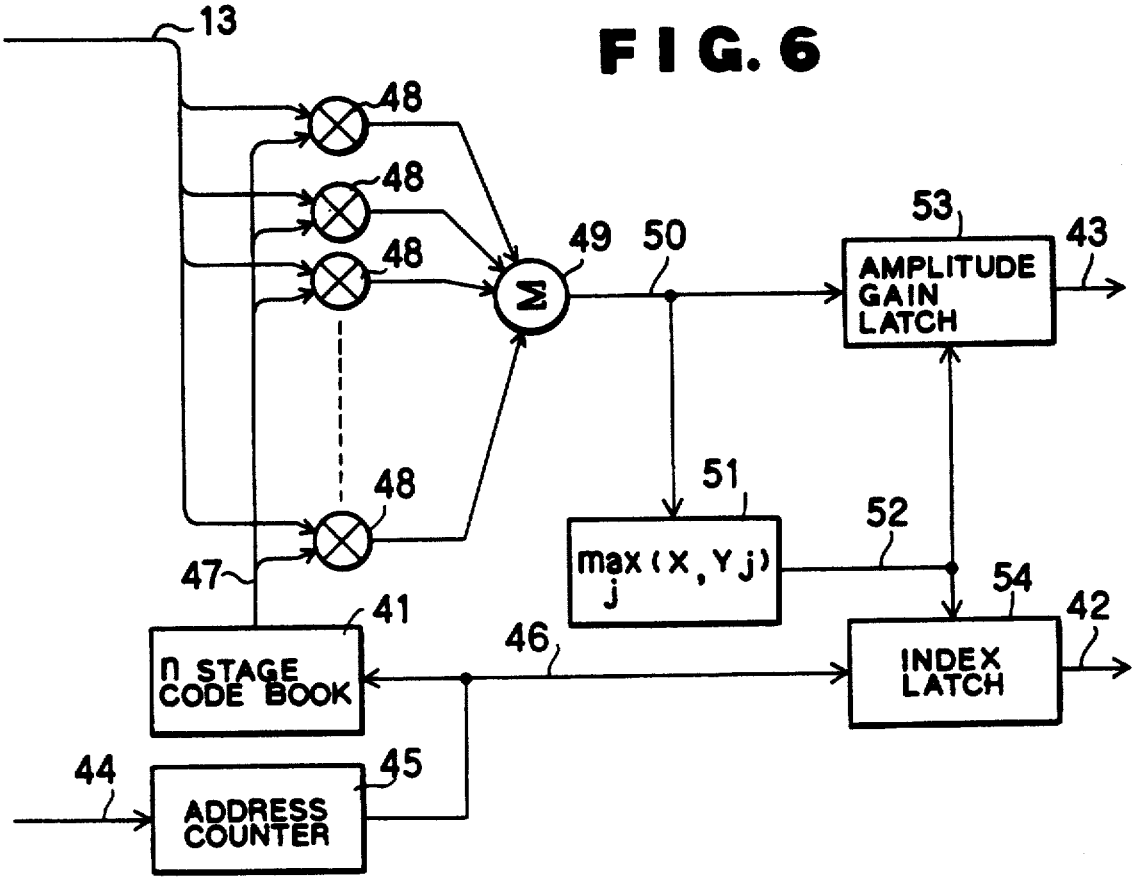
FIG. 6 is a block diagram of the quantizer at each stage of the tree-search vector quantizer.

FIG. 6 is a block diagram showing the operation of the vector quantizer which uses the inner product at each stage for the distortion computation. Indicated by 44 is the output vector index as a result of quantization by the vector quantizer at the preceding stage, 45 is an address counter which determines an output vector to be read out of the code book in accordance with the index of the preceding stage and produces the code book readout addresses 46 sequentially, 47 is the output vector read from code book 41 which is subjected to vector computation with the input vector 13, 48 are multipliers, 49 is an adder, 50 is the inner product value signal for the input vector and output vector, 51 is a maximum inner product detector which produces a strobe 52 upon detecting the maximum inner product value, 53 is an amplitude gain latch which holds the input inner product value signal 50 as the amplitude gain only upon receiving the strobe 52 from the maximum inner product detector 51, and 54 is an index latch which holds the readout address 46 of the entered code book only upon receiving the strobe 52 from the maximum inner product detector.

Next, the operation will be described.

In the coding section of FIG. 1, the input signal vector 1 to be coded is separated into the mean value 11 and mean separated input vector 13 by the mean value separation circuit 2. The mean value 11 is quantized by the DPCM quantizer 3, and the mean separated input vector 13 is subjected to computation of the magnitude of amplitude component by the amplitude component calculating circuit 4. In order to avoid an intricate computation, the amplitude of absolute value may be used as shown in the following. For a mean-value separation vector X, input signal vector S and mean value $\mu$, the amplitude $\sigma$ is given as follows.

$$S = [S_1, S_2, \ldots, S_k]$$
$$X_i = S_i - \mu$$
$$\sigma = \frac{1}{k} \sum_{i=1}^{k} |X_i|$$

The tree-search vector quantizer 6 implements tree-search quantization for the mean separated input vector 13, delivers the output vector index at each quantization stage to the index buffer 9, and provides the amplitude gain 14 based on the quantization result of quantizers with the quantization stage number which has been selected on the basis of the magnitude of the amplitude component by the amplitude vs. quantization stage correspondence table 5.

The amplitude vs. quantization search stage correspondence table is designed such that it provides a shallow quantization stage in response to a small amplitude component and provides a deep search stage as the amplitude component becomes larger.

The amplitude gain 14 evaluated by the tree-search vector quantizer 6, is quantized by the DPCM quantizer 7 to have the DPCM quantized amplitude gain 15, and the DPCM-decoded amplitude gain 16 is entered to the second amplitude vs. quantization stage correspondence table 8. The second amplitude vs. quantization stage correspondence table 8 revises the quantization stage number of the output vector index 18 which is finally outputted on the basis of the DPCM-decoded amplitude gain 16, and the index selector 10 makes selection from among the indices at quantization stages held in the index buffer 9 in accordance with the signal 17 indicating the output vector stage number. Consequently, the DPCM-quantized mean value 12, DPCM-quantized amplitude gain 15 and output vector index 18 are obtained as a coding output.

The decoding section of FIG. 2 receives the mean value 12, amplitude gain 15 and output vector index 18 which have been DPCM-quantized by the coding section. The mean value DPCM decoder 19 and amplitude gain DPCM decoder 20 implement decoding for the mean value 24 and amplitude gain 25. The amplitude vs. quantization stage correspondence table 8 produces from the amplitude gain 25 the quantization stage signal which indicates the same quantization stage number of the vector quantizer in the coding section, and sends it to the vector quantization decoder 21. The vector quantization decoder 21 decodes the output vector index 18 in accordance with the quantization stage number provided by the second amplitude vs. quantization stage correspondence table 8, and the normalized output vector 26 is obtained. The amplitude reproduction circuit 22 multiplies the decoded amplitude value 25 and adds the mean value 24 which has been decoded by the mean value adding circuit 23 to produce the output signal vector 28 as a decoded output.

In the tree-search vector quantizer of FIG. 5, each vector quantizer 40 which uses the inner product for the distortion computation determines an output vector providing a maximum inner product from among output vectors selected in each code book 41 on the basis of the vector quantization output vector index of the previous stage, sends the output vector index 42 to the quantizer of the next stage, and outputs the output vector index 42 and the amplitude gain 43 which is then inner product calculation result, as a quantization result of that stage.

FIG. 6 shows in more detail the vector quantizer of each stage, in which the address counter 45, upon receiving the previous stage vector quantizer output vector index 44, provides an output vector address to be compared with the input vector 13 in accordance with the tree-structure output vector. When the output vector 47 is read out of the code book 41, it is subjected to product-sum with the input vector 13. When the obtained inner product value 50 of vector has become maximum with respect to the input vector, the maximum inner product detector 51 issues a strobe, by which the amplitude gain latch 53 holds the inner product value 50 and the index latch 54 holds the output vector address 46. At the time point when the address counter 45 has outputted all output vector addresses 46 for the input vector 13, the values held in the amplitude gain latch and index latch are outputted as an amplitude gain 43 and output vector index 42 of that stage.

According to this embodiment, as described above, the inner product calculation is used for the distortion computation section of the vector quantizer, the quantization stage number of the tree-search vector quantizer is controlled by the magnitude of the vector amplitude component, and the final quantization stage number is determined from the quantization decoding result for the obtained amplitude gain, whereby the duty of the hardware can be reduced by using a DSP (digital signal processor) and it becomes possible to reduce the volume of information of the vector quantization index.

Another embodiment of this invention will be described referring to FIGS. 7–10.

Figure 7:
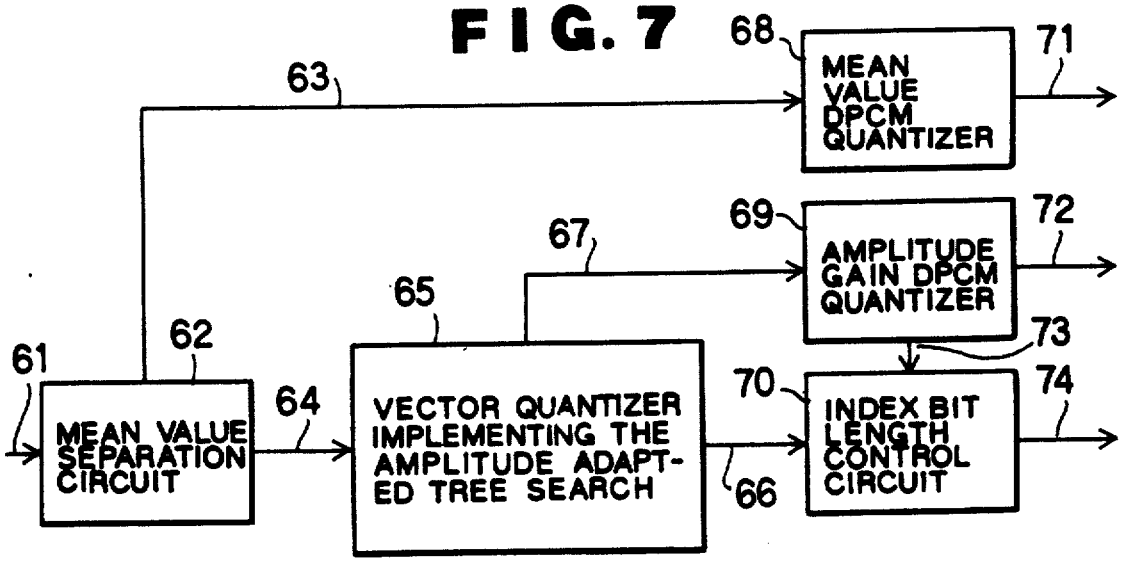
FIG. 7 shows the coding section of the vector quantization system according to another embodiment of this invention.

In the coding section of FIG. 7, indicated by 61 is the input vector which is a series of input signals made into blocks of K-piece units, 62 is a mean value separation circuit for the vector, 63 is the separated mean value, 64 is the mean separated input vector, 65 is a vector quantizer implementing the amplitude-adapted tree search, 66 is the code of output vector index in the last stage quantization, 67 is the amplitude gain for the input vector of the output vector in the last stage quantization, 68 is a mean value DPCM quantizer, 69 is an amplitude gain DPCM quantizer, 71 is the DPCM-quantized mean value, 72 is the DPCM-quantized amplitude gain, 73 is the DPCM-decoded amplitude gain, 70 is an index bit length control circuit which truncates from LSB the code 66 of output vector index in the final quantization in accordance with the DPCM-decoded amplitude gain 73, and 74 is the index code of the final output vector produced by truncation from LSB for the code 66 of the last stage output vector index in accordance with the amplitude gain 73.

Figure 8:
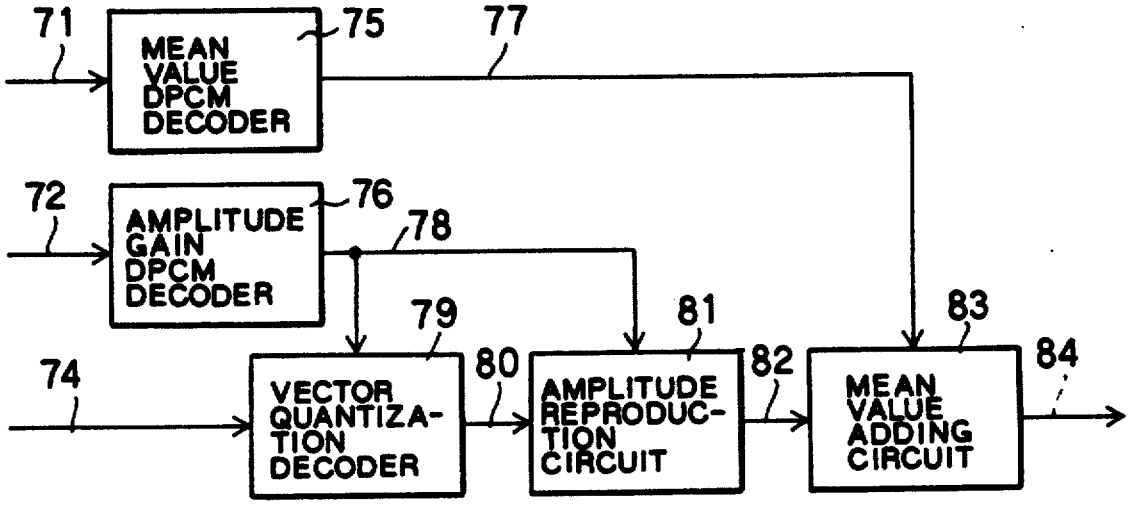
FIG. 8 is a block diagram of the decoding section.

In the decoding section of FIG. 8, indicated by 75 is a mean value DPCM decoder, 76 is an amplitude gain DPCM decoder, 77 is the DPCM-decoded mean value, 78 is the DPCM-decoded amplitude gain, 79 is a vector quantization decoder which decodes the index code 74 of the output vector which has been coded by the coding section using the DPCM-decoded amplitude gain 78, 80 is the decoded normalization output vector, 81 is an amplitude reproduction circuit, 82 is the amplitude-reproduced output vector, 83 is a mean value adding circuit, and 84 is the output signal vector.

Figure 9:
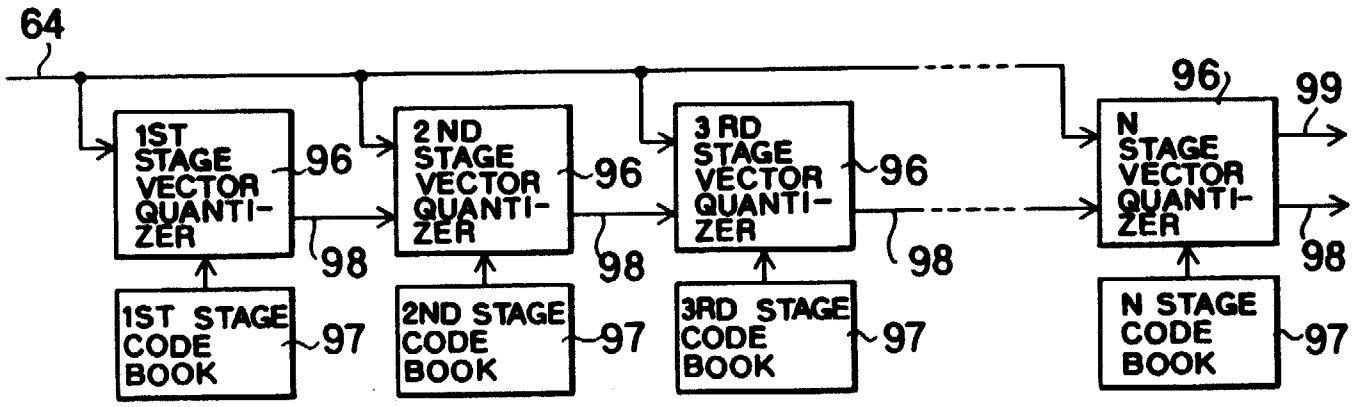
FIG. 9 is a block diagram of the tree-search vector quantizer.

FIG. 9 is a block diagram of the tree-search vector quantizer, showing the quantization operation by the quantizer 96 of each stage between the output vector read out of the code book 97 of each stage and the input vector 64, while making reference to the output vector index 98 of the previous-stage quantizer.

Figure 10:
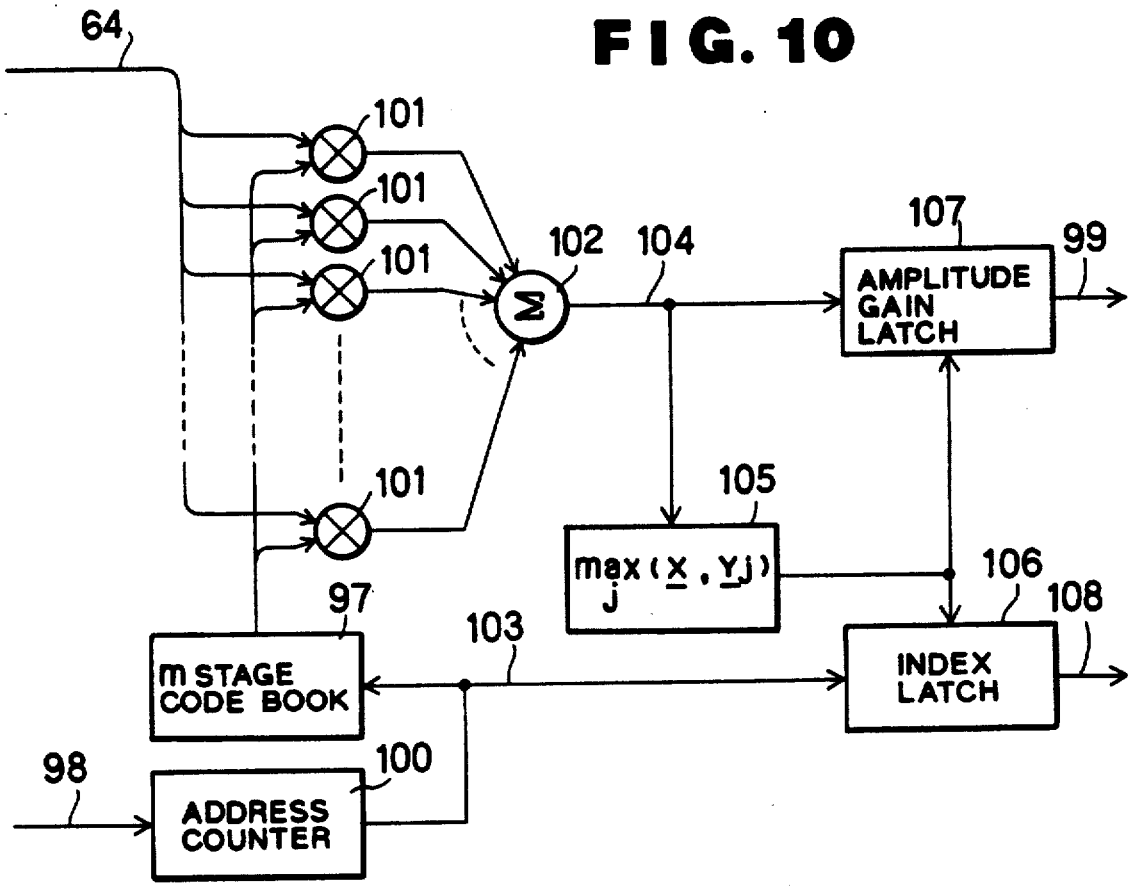
FIG. 10 is a detailed block diagram of the vector quantizer using the inner product for the computation of distortion.

FIG. 10 is a detailed block diagram of the vector quantizer which uses the inner product for the distortion computation. Indicated by 100 is an address counter which produces the readout address 103 sequentially while mapping the output vector address in accordance with the output vector index 98 of the previous-stage quantizer, 101 is a multiplier, 102 is an adder, 104 is the inner product value of input/output vectors, 105 is a maximum inner product detector which issues a strobe upon detecting a maximum inner product value, 106 is an index latch which holds the code book address and outputs it as the index, and 107 is an amplitude gain latch which holds the inner product value as an amplitude gain.

Next, the operation will be described.

In the coding section of FIG. 7, the input signal vector 61 received as blocks derived from a series of input signals is subjected to separation of the intra vector mean value 63, and it provides the mean value separation vector 64. The separated mean value 63 is subjected to DPCM quantization by the mean value DPCM quantizer 68.

Figure 11A:
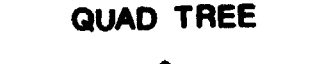
FIGS. 11a and 11b are diagrams explaining the relation between the tree-search and index code according to an embodiment of this invention.
Figure 11B:
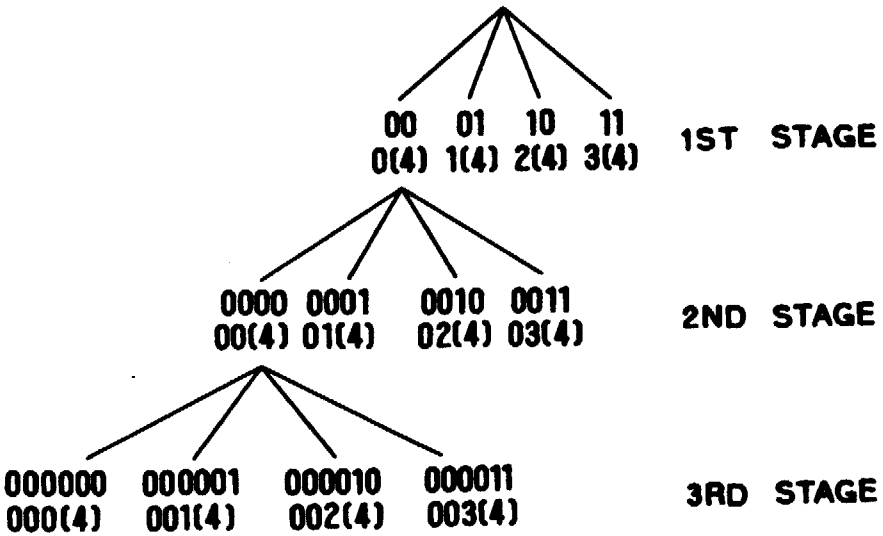

The mean separated input vector 64 is subjected to quantization by the vector quantizer 65 as follows. It is assumed that the output vector is tree search of n's notation system (n is a power of 2). FIG. 1 shows part of a binary tree and quad tree, as examples. The code of 50 index appended to the output vector of each node of tree structure is determined as shown in FIG. 11 for examples. The quad tree of FIG. 11(b) has its codes indicated in binary notation at the upper position and in quad notation at the lower position. As will be appreciated from the figure, the code increases by $\log_2 n$ bits (one bit in n's notation system) at each increment of the stage number, and nodes of the tree structure can be traced from lower toward upper stage of the tree structure by truncating $\log_2 n$ bits from LSB at a time.

By implementing tree search up to the last stage for the output vector code book, the mean-value separation input vector is rendered vectorial quantization using the inner product for the distortion computation. The tree search vector quantizer is expressed as a connection of vector quantizers as shown in FIG. 9, and the vector quantizer of the m-th stage is expressed by the block diagram of FIG. 10. In FIG. 10, upon receiving the output vector index 98 of the vector quantizer of the (m-l)th stage, the address counter 100 produces the address of the output vector to be compared with the input vector 64 on the basis of the tree structure output vector of n's notation system. After the output vector has been read out of the code book 97, it is subjected to the product-sum operation with the input vector 64. When the resulting vector inner product value 104 becomes maximum with respect to the input vector, the maximum inner product detector 104 issues a strobe, causing the amplitude gain latch 107 and index latch 106 to hold the inner product 104 and output vector address 103, respectively, and at the time point when the address counter 100 has outputted all output vector addresses 103 for the input vector 64, the value held in the index latch is outputted as an output vector index 108 of the m-th stage. If the m-th stage is the last stage, the value of the amplitude gain latch 107 is also outputted.

In FIG. 7, as a result of tree-search vector quantization up to the last stage for the mean value separation vector 64 entered in the tree-search vector quantizer 65, the index code 66 of the last-stage output vector and the amplitude gain 67 for the input vector 64 of the last-stage output vector are outputted, and the amplitude gain DPCM quantizer 69 provides the DPCM-quantized amplitude gain 72 and amplitude gain 73 which is the DPCM-decoded version of 72. The amplitude gain which is the inner product of vector indicates the amplitude component of input vector, in case of implementation of proper vectorial quantization, and therefore mapping is conducted for the tree search quantization stage on the basis of the DPCM-decoded amplitude gain 73 so that an output vector of a shallow stage of tree structure is selected for a small amplitude gain or an output vector of a deep stage is selected for a large amplitude gain. As has been mentioned on FIG. 11, in order to obtain the index code of the output vector selected in the search process, the index bit length control circuit 70 implements the truncation operation for the index code of the last-stage output vector from LSB by $\log_2 n$ bits at a time for the stage determined depending on the amplitude gain 73. For the mapping of the DPCM-decoded amplitude gain 73 to the search stage number, predetermined ones are stored in advance for both the coding side and decoding side. In this way, the output vector in the midst of the tree structure is also selected in accordance with the amplitude gain, and a shorter bit length results in more efficient quantization.

In the decoding section of FIG. 8, the mean value and amplitude gain DPCM decoders 75 and 76 implement DPCM decoding, and the DPCM-decoded amplitude gain 78 is used by the vector quantization decoder 79 in mapping for determining which stage the output vector index code 74 is located in the tree structure, the normalized output vector 80 decoded by the vector quantization decoder is subjected to amplitude reproduction by the amplitude reproducing circuit 81 and mean value addition by the mean value adding circuit 83, and the final output signal vector 84 is decoded.

Figure 12:
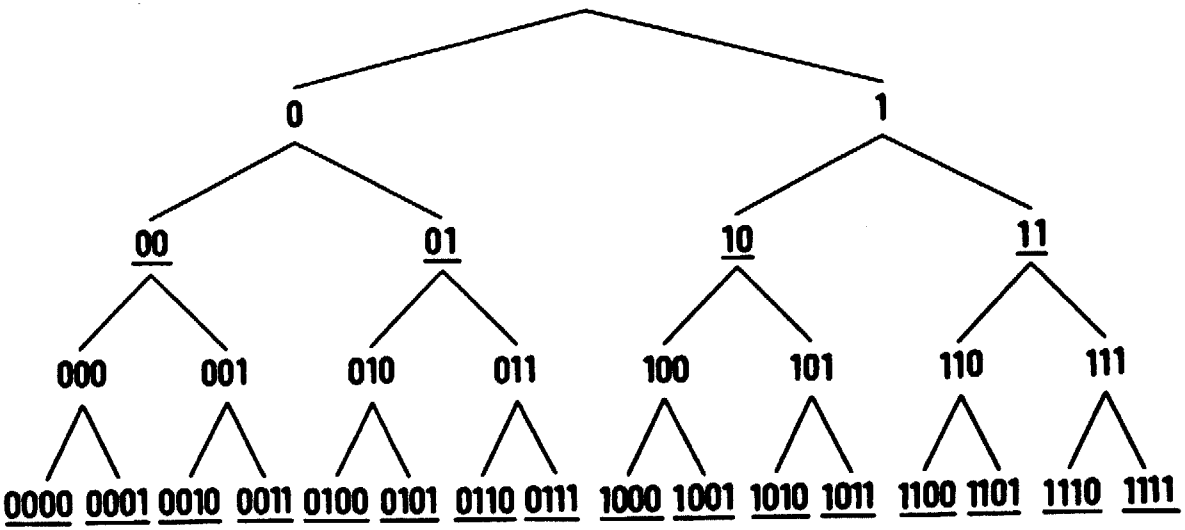
FIG. 12 is a diagram explaining the relation between the tree-search and index code according to another embodiment of this invention.

Although shown in the foregoing embodiment is the method of truncating from LSB in units of $\log_2 n$ bits for the last-stage index in the tree structure of n's notation system in correspondence to the DPCM-decoded amplitude gain, another possible method is that a tree structure of n's notation system is assumed to be part of a binary tree structure and the code is truncated in 1-bit units from LSB. In this case, the following precaution must be taken. In FIG. 12 showing a binary tree, collection of nodes with underlined codes makes a quad tree. Namely, any tree structure of n's notation system (n is a power of 2) can be assumed to be the result of pull-off of stages of a binary tree in accordance with the rule. In the case of a quad tree, for example, although the output vector exists only at nodes with underlined codes in FIG. 12 as a code book, when a vector which is the average output vector of two underlined nodes in much lower stage is outputted for nodes without underline, it becomes possible to truncate the codes in one bit units. Consequently, the volume of information generation by the amplitude component can be controlled more precisely.

According to the other embodiment of this invention, as described, the output vector code book of the vector quantizer is configured in the tree search structure of n's notation system, tree search vector quantization is implemented up to the last stage by truncating the index code from the low-order bit in accordance with the rule and by outputting the output vector of nodes in the midst of tree search, and the tree-search quantization stage is determined from the decoded amplitude gain obtained by DPCM coding/decoding the amplitude gain obtained by quantization of the last stage thereby to obtain the index code of the above-mentioned node, whereby it becomes possible to reduce the volume of information of the index in a sense of adaptation to the amplitude component of vector without incurring the complexity of vector quantizer used for the inner product calculation which allows the reduction of duty of the hardware by using a DSP or the like.

According to this invention, as described, index information is truncated in accordance with the detected vector amplitude component, thereby reducing the volume of information transmitted, whereby the hardware can be made smaller to reduce its duty through the use of DSP or the like.

What is claimed is:

1. An amplitude-adaptive vector quantization system comprising:

a mean value separating circuit which receives K-dimensional vectors derived from a continuous series of input signals divided into blocks of K-samples and separates out a mean value of said input signal vectors;

a predictive differential quantizer which implements DPCM quantization for said separated mean value;

an amplitude component calculation circuit which calculates the magnitude of amplitude components of mean separated input vectors;

a first amplitude vs. quantization stage correspondence table which determines a quantization [state] *stage* of tree-search vector quantization in correspondence to the magnitude of said calculated amplitude components; and a tree-search vector quantizer which calculates the inner product between each of said mean separated input vectors and normalized output vectors with zero mean arranged to have a tree structure, implements a tree-search for an output vector providing a maximum inner product sequentially up to a last stage, provides a maximum inner product at each stage as an amplitude gain at each stage along with an output vector index, and outputs selectively an amplitude gain of a quantization stage prescribed by said first amplitude vs. quantization stage correspondence table;

an index buffer which holds the output vector index of each quantization stage obtained during the quantization of said tree-search vector quantizer;

an amplitude gain DPCM quantizer which implements DPCM quantization for said output amplitude gain to provide a DPCM-quantized differential amplitude gain and implements DPCM decoding to provide a reproduction of DPCM-quantized amplitude gain;

a second amplitude vs. quantization stage correspondence table which provides a true quantization stage selection signal from said DPCM-decoded reproduction amplitude gain;

a coding section which has an index selector for selecting an output vector to be outputted finally from among output vector indices of all stages held in said index buffer, and transmits or records three elements, including said DPCM-quantized mean value, DPCM-quantized amplitude gain and selected output vector, as a coding output; and a decoding section including a mean value DPCM decoder and amplitude gain DPCM decoder which implement DPCM decoding for the DPCM quantized mean value and amplitude gain coded by said coding section respectively, an amplitude vs. quantization stage correspondence table which has the same content as said second amplitude vs. quantization stage correspondence table to determine from the DPCM-decoded amplitude gain a quantization output of which stage of coding section is the output vector index decoded by a vector quantization decoder, said vector quantization decoder implementing decoding for said output vector index by switching output vectors adaptively in response to an output of said amplitude vs. quantization stage correspondence table, an amplitude reproducing circuit which implements amplitude reproduction of said decoded normalized output vector on the basis of said DPCM-decoded amplitude gain, and a mean value adding circuit which adds said DPCM-decoded mean value to said amplitude reproduced vector to produce an output signal vector.

2. An amplitude-adaptive vector quantization system according to claim 1, wherein each of said amplitude vs. quantization stage correspondence tables, in case of controlling the depth of tree of tree-search vector quantization adaptively in accordance with the amplitude gain, comprises an amplitude gain vs. quantization stage correspondence table which provides a quantization stage number n which is a depth of tree search, in terms of a dimension r of tree (n is an integer greater than one), amplitude gain $\sigma$, and constants a and b, as $n = a \cdot \log_r(\sigma/b)$.

3. An amplitude-adapted vector quantization system comprising:

a mean value separating circuit which receives K-dimensional vectors derived from a continuous series of input signals divided into blocks in K-samples units (K is an integer greater than one) and separates out a mean value of said input signal vectors;

a mean value predictive differential (will be termed "DPCM") quantizer which implements DPCM quantization for said separated mean value;

a tree-search vector quantizer of n's notation system (n is a power of 2) which receives the mean separated vectors provided by said mean value separation circuit as input vectors, calculates the inner product between each of the mean value separation vectors and normalized output vectors read out of a tree-search code book of n's notation system, implements tree-search for an output vector providing a maximum inner product sequentially up to a last-stage, and provides a then maximum inner product value as an amplitude gain along with an output vector index providing a maximum inner product at a last-stage quantization, and an amplitude gain DPCM quantizer which implements DPCM quantization for the last-stage quantization amplitude gain provided by said vector quantizer to produce a DPCM-quantized amplitude gain through DPCM quantization, implements DPCM decoding, and produces a DPCM-decoded amplitude gain;

a coding section including an index bit length control circuit which receives an index code of the last-stage quantization output vector provided by said vector quantizer and truncates the index code for a specified number of bits from the lowest bit position (will be termed "LSB") in correspondence to the magnitude of said decoded amplitude gain value, and tree-search code book of n's notation system constructed to express the index code of output vector at nodes of each stage selected during the search up to the last stage through truncation in $\log_2 n$ bit units from LSB for the code of last-stage output vector index with the intention of use by said vector quantizer; and a decoding section including a mean value DPCM decoder and amplitude gain DPCM decoder for respectively decoding the mean-value and amplitude gain coded by said coding section, a vector quantization decoder which recognizes the index code length of the output vector to be decoded from the amplitude gain decoded by said amplitude gain DPCM decoder, an amplitude reproduction circuit which multiplies the decoded amplitude gain to the decoded output vector and a mean value adding circuit which adds the DPCM decoded mean value to the multiplication result.

4. An amplitude-adapted vector quantization system according to claim 3, wherein said tree search code book of n's notation system ($n \geqq 4$), in case one quantization stage has an index code length of 1 bit, is provided with an output vector having for the index a code with a length of 1-j bits ($j < \log_2 n$), said code book including, for all or part of 1 and j, an output vector that is a mean output vector, with its high-order (1-j) bits being coincident, among output vectors having 1-bit code, said index bit length control circuit being provided with a width for the control of truncating bits in accordance with the DPCM-decoded amplitude gain.

*5. An amplitude-adaptive vector quantization encoding system, comprising:*

*an amplitude component calculation circuit which calculates the magnitude of amplitude components of input vectors derived from a continuous series of input signals;*

*an amplitude vs. quantization stage correspondence table which determines a tree-search vector quantization stage in correspondence to a calculated magnitude of amplitude components;*

*a tree-search vector quantizer which calculates, for each of said input vectors, the inner product between an input vector and normalized output vectors arranged in a tree structure, implements a tree search for an output vector providing a maximum inner product for each input vector at each stage of said tree structure up to a predetermined stage described by said amplitude vs. quantization stage correspondence table, provides a maximum inner product at each stage as an amplitude gain along with an output vector index, and outputs selectively an amplitude gain of said predetermined stage;*

*an index buffer which holds the output vector index of each quantization stage provided during the quantization operation of said tree-search vector quantizer; and*

*means for transmitting the output vector index held in said index buffer which corresponds to the output vector providing a maximum inner product at said predetermined stage.*

*6. An amplitude-adaptive vector quantization encoding system, comprising:*

*an amplitude component calculation circuit which calculates the magnitude of amplitude components of input vectors derived from a continuous series of input signals;*

*an amplitude vs. quantization stage correspondence table which determines a tree-search vector quantization stage in correspondence to a calculated magnitude of amplitude components;*

*a tree-search vector quantizer which calculates, for each of said input vectors, the amount of distortion between an input vector and normalized output vectors arranged in a tree structure, implements a tree search for an output vector providing a minimum amount of distortion for each input vector at each stage of said tree structure up to a predetermined stage prescribed by said amplitude vs. quantization stage correspondence table, provides a minimum distortion value at each stage as an amplitude gain along with an output vector index, and outputs selectively an amplitude gain of said predetermined stage;*

*an index buffer which holds the output vector index of each quantization stage provided during the quantization operation of said tree-search vector quantizer; and*

*means for transmitting the output vector index held in said index buffer which corresponds to the output vector providing a minimum distortion at said predetermined stage.*

*7. An amplitude-adaptive vector quantization decoding system, comprising:*

*means for receiving a continuous series of coded signals each including an amplitude gain and an output vector index, said amplitude gain representing an inner product of an input vector and an output vector represented by said output vector index;*

*an amplitude component decoding circuit which decodes said amplitude gain from said series of received coded signals;*

*an amplitude vs. quantization stage correspondence table which determines a tree-search vector quantization stage in correspondence to a decoded amplitude gain;*

*a vector quantization decoder which decodes said output vector index in correspondence with said determined tree-search vector quantization stage to obtain a normalized output vector; and*

*an amplitude reproducing circuit which implements amplitude reproduction of said normalized output vector in correspondence with said decoded amplitude gain.*

*8. An amplitude-adaptive vector quantization decoding system, comprising:*

*means for receiving a continuous series of coded signals each including an amplitude gain and an output vector index, said amplitude gain representing an amount of distortion between an input vector and an output vector represented by said output vector index;*

*an amplitude component decoding circuit which decodes said amplitude gain from said series of received coded signals;*

*an amplitude vs. quantization stage correspondence table which determines a tree-search vector quantization stage in correspondence to said decoded amplitude gain;*

*a vector quantization decoder which decodes said output vector index in correspondence with said determined tree-search vector quantization stage to obtain a normalized output vector; and*

*an amplitude reproducing circuit which implements amplitude reproduction of said normalized output vector in correspondence with said decoded amplitude gain.*

*9. An amplitude-adaptive vector quantization encoding system, comprising:*

*a tree-search vector quantizer of n's notation system (wherein n is a power of 2) which receives input vectors derived from a continuous series of input signals, calculates, for each of said input vectors, the inner product between an input vector and normalized output vectors read out of a tree-search code book of n's notation system provided in stages, implements a tree search for an output vector providing a maximum inner product at each stage up to a predetermined stage, and provides a maximum inner product value as an amplitude gain along with an output vector index representing said output vector providing said maximum inner product value at said predetermined stage; and*

*a coding section including an index bit length control circuit which receives said output vector index provided by said tree-search vector quantizer and truncates said output vector index by a specified number of bits in correspondence with the magnitude of said amplitude gain, and said tree-search code book of n's notation system which is constructed to express the output vector index at each stage of said tree search up to said predetermined stage through truncation in $\log_2 n$ bit units for use by said vector quantizer.*

*10. An amplitude-adaptive vector quantization encoding system, comprising:*

*a tree-search vector quantizer of n's notation system (wherein n is a power of 2) which receives input vectors derived from a continuous series of input signals, calculates, for each of said input vectors, the amount of distortion between an input vector and normalized output vectors read out of a tree-search code book of n's notation system provided in stages, implements a tree search for an output vector providing a minimum distortion at each stage up to a predetermined stage, and provides a minimum distortion value as an amplitude gain along with an output vector index representing said output vector providing said minimum value at said predetermined stage; and*

*a coding section including an index bit length control circuit which receives said output vector index provided by said tree-search vector quantizer and truncates said output vector index by a specified number of bits in correspondence with the magnitude of said amplitude gain, and said tree-search code book of n's notation system which is constructed to express the output vector index at each stage of said tree search up to said predetermined stage through truncation in $\log_2 n$ bit units for use by said vector quantizer.*

* * * * *

UNITED STATES PATENT AND TRADEMARK OFFICE

CERTIFICATE OF CORRECTION

PATENT NO. : Re. 34,562

DATED : March 15, 1994

INVENTOR(S) : T. Murakami et al.

It is certified that error appears in the above-identified patent and that said Letters Patent is hereby corrected as shown below:

Col. 7, line 60, "Fig. 1" should be --Fig. 11--.

Col. 8, line 21, "104" should be --105--.

Signed and Sealed this

Sixth Day of September, 1994

*Attest:*

Bruce Lehman

BRUCE LEHMAN

*Attesting Officer*

*Commissioner of Patents and Trademarks*